(12) United States Patent
Reznicek et al.

(10) Patent No.: US 10,896,912 B2
(45) Date of Patent: Jan. 19, 2021

(54) STACKED VERTICAL TRANSISTOR ERASABLE PROGRAMMABLE READ-ONLY MEMORY AND PROGRAMMABLE INVERTER DEVICES

(71) Applicant: International Business Machines Corporation, Armonk, NY (US)

(72) Inventors: Alexander Reznicek, Troy, NY (US); Karthik Balakrishnan, Scarsdale, NY (US); Tak Ning, Yorktown Heights, NY (US); Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/359,070

(22) Filed: Mar. 20, 2019

(65) Prior Publication Data
US 2020/0303388 A1    Sep. 24, 2020

(51) Int. Cl.
*H01L 27/11541*    (2017.01)
*H01L 29/788*    (2006.01)
(Continued)

(52) U.S. Cl.
CPC .. *H01L 27/11541* (2013.01); *H01L 21/28518* (2013.01); *H01L 21/823814* (2013.01); *H01L 21/823857* (2013.01); *H01L 21/823871* (2013.01); *H01L 21/823885* (2013.01); *H01L 27/092* (2013.01); *H01L 29/0847* (2013.01);
(Continued)

(58) Field of Classification Search
CPC ......... H01L 27/11541; H01L 29/40114; H01L 29/7827; H01L 29/7889; H01L 29/66825; H01L 21/28518; H01L 27/092; H01L 29/0847; H01L 21/823885; H01L 21/823857; H01L 21/823814; H01L 29/66545; H01L 29/45; H01L 29/42364;
(Continued)

(56) References Cited

U.S. PATENT DOCUMENTS 5,321,286 A    6/1994   Koyama et al.
5,420,447 A *   5/1995   Waggoner ......... H01L 27/11807
                                              257/202

(Continued)

OTHER PUBLICATIONS

C.-H. Yu et al., "Performance and Stability Benchmarking of Monolithic 3-D Logic Circuits and SRAM Cells with Monolayer and Few-Layer Transistion Metal Dichalcogenide MOSFETs," IEEE Transactions on Electron Devices, May 2017, pp. 2445-2451, vol. 64, No. 5.

(Continued)

*Primary Examiner* — Marcos D. Pizarro
(74) *Attorney, Agent, or Firm* — Robert Sullivan; Ryan, Mason & Lewis, LLP

(57) ABSTRACT

A method for manufacturing a semiconductor device includes forming a first vertical transistor on a semiconductor substrate, and forming a second vertical transistor stacked on the first vertical transistor. In the method, a silicide layer is formed on a first drain region of the first vertical transistor and on a second drain region of the second vertical transistor. The silicide layer electrically connects the first and second drain regions to each other.

13 Claims, 11 Drawing Sheets

(51) Int. Cl.

| | | |
|---|---|---|
| *H01L 21/8238* | (2006.01) | |
| *H01L 21/285* | (2006.01) | |
| *H01L 29/66* | (2006.01) | |
| *H01L 27/092* | (2006.01) | |
| *H01L 29/08* | (2006.01) | |
| *H01L 29/423* | (2006.01) | |
| *H01L 29/45* | (2006.01) | |
| *H01L 29/78* | (2006.01) | |
| *H01L 21/28* | (2006.01) | |

(52) U.S. Cl.
CPC .. *H01L 29/40114* (2019.08); *H01L 29/42364* (2013.01); *H01L 29/45* (2013.01); *H01L 29/665* (2013.01); *H01L 29/66545* (2013.01); *H01L 29/66666* (2013.01); *H01L 29/66825* (2013.01); *H01L 29/7827* (2013.01); *H01L 29/7889* (2013.01)

(58) Field of Classification Search
CPC ........... H01L 29/665; H01L 21/823871; H01L 29/66666
See application file for complete search history.

(56) References Cited

U.S. PATENT DOCUMENTS

| | | | |
|---|---|---|---|
| 5,914,504 A * | 6/1999 | Augusto | ........... H01L 21/82388 257/192 |
| 6,808,971 B2 | 10/2004 | Bhattacharyya | |
| 7,098,505 B1 | 8/2006 | Han et al. | |
| 7,700,993 B2 | 4/2010 | Cai et al. | |
| 8,004,893 B2 | 8/2011 | Sim et al. | |
| 8,664,631 B2 | 3/2014 | Hirota et al. | |
| 8,705,280 B2 | 4/2014 | Cai et al. | |
| 9,646,994 B2 | 5/2017 | Liu et al. | |
| 9,666,489 B1 | 5/2017 | Balakrishnan et al. | |
| 9,824,933 B1 | 11/2017 | Pawlak | |
| 10,366,983 B2 * | 7/2019 | Beigel | ................. H01L 21/8221 |
| 2007/0010061 A1 * | 1/2007 | Forbes | ............. H01L 21/31641 438/287 |
| 2014/0340952 A1 * | 11/2014 | Ramaswamy | ........ G11C 11/223 365/51 |
| 2018/0005904 A1 | 1/2018 | Lee et al. | |
| 2020/0066741 A1 * | 2/2020 | Wu | ................... H01L 27/11565 |

OTHER PUBLICATIONS

M.-L. Fan et al., "Investigation and Optimization of Monolithic 3D Logic Circuits and SRAM Cells Considering Interlayer Coupling," IEEE International Symposium on Circuits and Systems (ISCAS), Jun. 1-5, 2014, pp. 1130-1133.

V. Pi-Ho Hu et al., "Investigation of BTI Reliability for Monolithic 3D 6T SRAM with Ultra-Thin-Body GeOI MOSFETs," IEEE International Symposium on Circuits and Systems (ISCAS), May 22-25, 2016, pp. 2106-2109.

* cited by examiner

100

100

STACKED VERTICAL TRANSISTOR ERASABLE PROGRAMMABLE READ-ONLY MEMORY AND PROGRAMMABLE INVERTER DEVICES

BACKGROUND

Fin field-effect transistor (FinFET) devices include a transistor architecture that uses raised source-to-drain channel regions, referred to as fins. Known FinFET devices include fins with source/drain regions on lateral sides of the fins, so that current flows in a horizontal direction (e.g., parallel to a substrate) between source/drain regions at opposite ends of the fins in the horizontal direction. As horizontal devices are scaled down, there is reduced space for metal gate and source/drain contacts, which leads to degraded short-channel control and increased middle of the line (MOL) resistance.

Vertical field-effect transistors (VFETs) (also referred to as vertical transport field effect transistors (VTFETs)) are becoming viable device options for scaling semiconductor devices (e.g., complementary metal oxide semiconductor (CMOS) devices) to 5 nanometer (nm) node and beyond. VFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region.

VFET-based technologies utilize memory structures, including, for example, programmable inverters and erasable programmable read-only memory (EPROM) for memory cells for custom chip structures. In order to minimize processing costs and improve integration, there is a need for semiconductor configurations and techniques for manufacturing same which permit formation of memory structures during VFET fabrication.

SUMMARY

According to an exemplary embodiment of the present invention, a method for manufacturing a semiconductor device includes forming a first vertical transistor on a semiconductor substrate, and forming a second vertical transistor stacked on the first vertical transistor. In the method, a silicide layer is formed on a first drain region of the first vertical transistor and on a second drain region of the second vertical transistor. The silicide layer electrically connects the first and second drain regions to each other.

According to an exemplary embodiment of the present invention, a semiconductor device includes a first vertical transistor disposed on a semiconductor substrate, and a second vertical transistor stacked on the first vertical transistor. A silicide layer is disposed on a first drain region of the first vertical transistor and on a second drain region of the second vertical transistor. The silicide layer electrically connects the first and second drain regions to each other.

According to an exemplary embodiment of the present invention, a method for manufacturing a vertical transistor device includes forming a bottom source region on a semiconductor substrate, forming a first channel region extending vertically from the bottom source region, and forming a first drain region on an upper portion of the first channel region. The method also includes forming a second drain region on an upper portion of the first drain region, forming a second channel region extending vertically from the second drain region, and forming a top source region on an upper portion of the second channel region. In the method, a first gate region is formed around the first channel region, and a second gate region is formed around the second channel region. A silicide layer, which electrically connects the first and second drain regions to each other, is formed on the first and second drain regions.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 2:
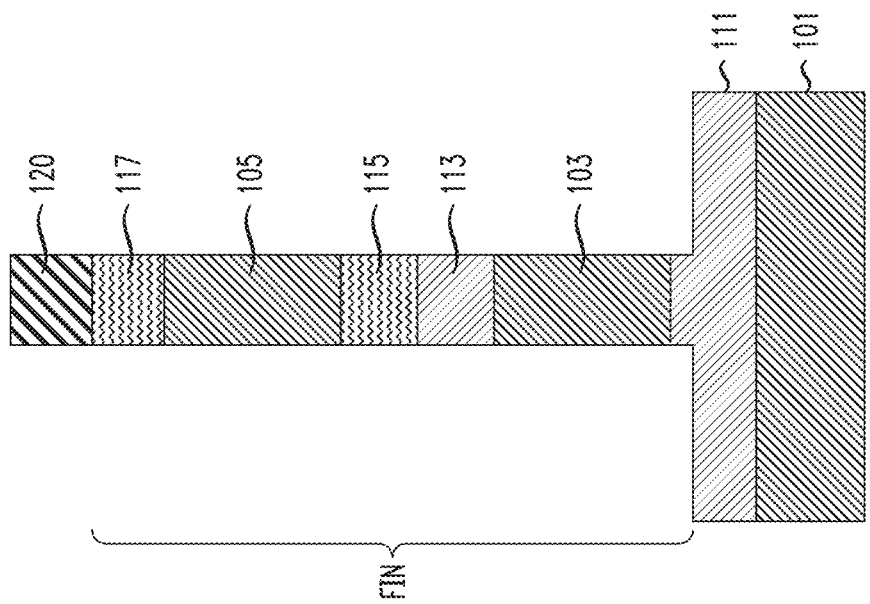
FIG. 2 is a cross-sectional illustrating fin formation in a method of manufacturing a semiconductor device, according to an exemplary embodiment of the present invention.

Exemplary embodiments of the invention will now be discussed in further detail with regard to semiconductor devices and methods of manufacturing same and, in particular, to forming stacked vertical transistor devices.

It is to be understood that the various layers and/or regions shown in the accompanying drawings are not drawn to scale, and that one or more layers and/or regions of a type commonly used in, for example, FinFET, VFET, CMOS, field-effect transistor (FET), nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not necessarily be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FinFETs, VFETs, CMOSs, FETs, nanowire FETs, nanosheet FETs, SETs, and/or MOSFETs. By way of non-limiting example, the semiconductor devices can include, but are not necessarily limited to FinFET, VFET, CMOS, FET, nanowire FET, nanosheet FET, SET, CMOS and MOSFET devices, and/or semiconductor devices that use FinFET, VFET, CMOS, FET, nanowire FET, nanosheet FET, SET, CMOS and/or MOSFET technology.

As used herein, "height" refers to a vertical size of an element (e.g., a layer, trench, hole, opening, etc.) in the cross-sectional or three-dimensional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional or three-dimensional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional or three-dimensional views, and "horizontal" refers to a direction parallel to the top surface of the substrate in the cross-sectional or three-dimensional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

In accordance with one or more embodiments, an EPROM is fabricated during stacked vertical transistor (e.g., VFET) CMOS fabrication to minimize processing costs and improve system integration. One or more embodiments provide a method and structure for forming an EPROM building block with an n-type FET (NFET) and a p-type FET (PFET) stacked vertically. A common terminal (e.g., drain terminal) between the NFET and PFET is formed and buried to save chip area.

The embodiments provide a CMOS EPROM cell structure or a CMOS programmable inverter structure integrated in a stacked vertical transistor manufacturing flow. In accordance with an embodiment, an NFET is stacked directly on top of a floating-gate PFET. As a result, one EPROM cell or one CMOS programmable inverter occupies the area of only one device, as opposed to a PFET and an NFET being laterally next to each other on a substrate. Alternatively, the EPROM cell or CMOS programmable inverter may comprise a PFET stacked directly on top of a floating-gate NFET.

Two VFETs are stacked in parallel with a common drain, a connected gate, a floating gate, and connected sources.

Figure 1:
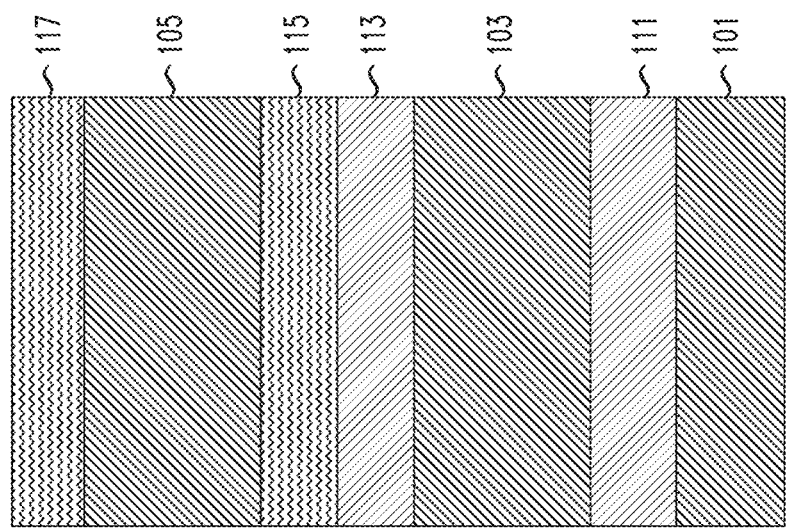
FIG. 1 is a cross-sectional view illustrating epitaxial growth of a plurality of semiconductor layers in a method of manufacturing a semiconductor device, according to an exemplary embodiment of the present invention.

FIG. 1 is a cross-sectional view illustrating epitaxial growth of a plurality of semiconductor layers in a method of manufacturing a semiconductor device, according to an exemplary embodiment of the present invention. Referring to FIG. 1, a semiconductor substrate 101 includes semiconductor material including, but not limited to, silicon (Si), silicon germanium (SiGe), silicon carbide (SiC), II-VI compound semiconductor or other like semiconductor. In addition, multiple layers of the semiconductor materials can be used as the semiconductor material of the substrate. The semiconductor substrate 101 can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide, nitride layer or aluminum oxide.

Multiple layers 103, 105, 111, 113, 115 and 117 are epitaxially grown on the semiconductor substrate 101 by an integrated epitaxy process. A first doped layer 111 (e.g., p+ doped layer) is formed on the substrate 101. According to an embodiment, the layer 111 is a p-type doped layer comprising epitaxially grown silicon (Si), silicon germanium (SiGe) or other semiconductor material, which is doped during epitaxial growth by in-situ doping and a dopant may include, for example, boron (B), at various concentrations. For example, in a non-limiting example, a dopant concentration range may be $1 \times 10^{20}/cm^3$ to $1 \times 10^{21}/cm^3$ to form a bottom source region.

During the integrated epitaxy process, an undoped layer 103 including, for example, silicon (Si), silicon germanium (SiGe) or other semiconductor material, is epitaxially grown on the first doped layer 111. A patterned portion of the undoped layer 103 will form a channel region for a lower FET of two stacked FETs. A second doped layer 113 (e.g., p+ doped layer) is formed on the undoped layer 103. According to an embodiment, the layer 113 is a p-type doped layer comprising epitaxially grown Si, SiGe, or other semiconductor material, doped with, for example, B, at various concentrations. For example, the layer 113 may comprise the same or similar material, dopant and dopant concentration as the layer 111. The layer 113 can be doped during epitaxial growth by in-situ doping. A patterned portion of the layer 113 forms a drain region for a FET (e.g. PFET) comprising patterned portions of layers 111, 103 and 113.

A third doped layer 115 (e.g., n+ doped layer) is formed on the second doped layer 113. According to an embodiment, the layer 115 is an n-type doped layer comprising epitaxially grown Si, SiGe or other semiconductor material, which is doped by, for example, in-situ doping, and dopants may include, for example, phosphorus (P) or arsenic (As) at various concentrations. For example, in a non-limiting example, a dopant concentration range may be $1 \times 10^{20}/cm^3$ to $1 \times 10^{21}/cm^3$ to form a drain region of a FET (e.g., NFET) comprising patterned portions of layers 115, 105 and 117.

Another undoped layer 105 is formed on the third doped layer 115. The undoped layer 105 includes, for example, Si, SiGe or other semiconductor material, epitaxially grown on the third doped layer 115. A patterned portion of the undoped layer 105 will form a channel region for an upper FET of two stacked FETs. A fourth doped layer 117 (e.g., n+ doped layer) is formed on the undoped layer 105. According to an embodiment, the layer 117 is an n-type doped layer comprising epitaxially grown Si, SiGe, or other semiconductor material, doped with, for example, P or As at various concentrations. For example, the layer 117 may comprise the same or similar material, dopant and dopant concentration as the layer 115. The layer 117 can be doped during epitaxial growth by in-situ doping. A patterned portion of the layer 117 forms a source region for a FET (e.g. NFET) comprising patterned portions of layers 115, 105 and 117.

FIG. 1 illustrates layers for the formation of an NFET (layers 115, 105 and 117) stacked on top of layers for the formation of a PFET (layers 111, 103 and 113). In an alternative embodiment, polarities may be reversed such that a PFET is stacked on an NFET. In the case of a PFET is stacked on an NFET, wiring would be different than the embodiment of an NFET stacked on a PFET. In the alternative embodiment, the PFET on the top would have a floating gate, and the NFET gate on the bottom would be connected to a gate contact.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, ldisilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

FIG. 2 is a cross-sectional illustrating fin formation in a method of manufacturing a semiconductor device, according to an exemplary embodiment of the present invention. Referring to FIG. 2, a hardmask 120 including, for example silicon nitride (SiN) or other material, such as, but not necessarily limited to, silicon boron nitride (SiBN), silicon-borocarbonitride (SiBCN) or siliconoxycarbonitride (SiOCN), is deposited on the fourth doped layer 117. Exposed portions of the layers 111, 103, 113, 115, 105 and 117 not protected by the hardmask 120 are removed down through part of the first doped layer 111 using an etch process, such as, for example, an anisotropic etch process, including, but not limited to, a reactive ion etch (RIE) process. As can be seen, the resulting structure of the fin includes parts of layers 111, 103, 113, 115, 105 and 117 under the hardmask 120. While embodiments of the present invention describe a fin, the embodiments are not necessarily limited thereto, and may include nanowire regions. The drawings illustrate one fin on the substrate 101. Although one fin is shown in the figures for ease of explanation, more than one fin can be formed.

Figure 3:
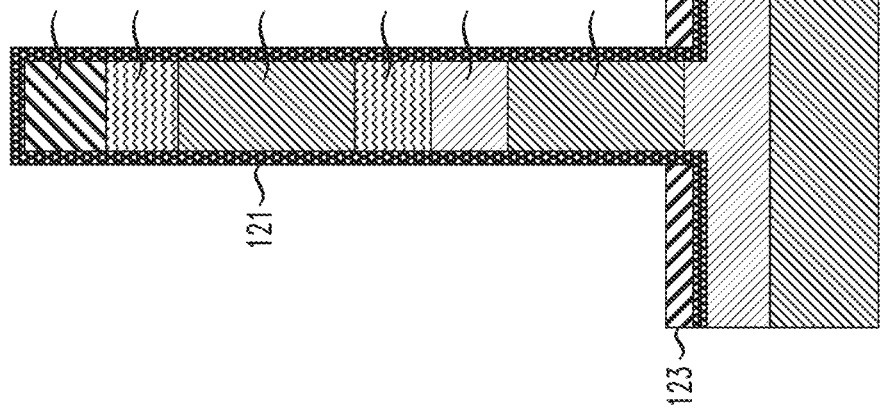
FIG. 3 is a cross-sectional view illustrating dielectric liner layer formation in a method of manufacturing a semiconductor device, according to an exemplary embodiment of the present invention.

FIG. 3 is a cross-sectional view illustrating dielectric liner layer formation in a method of manufacturing a semiconductor device, according to an exemplary embodiment of the present invention. Referring to FIG. 3, a dielectric liner layer 121 is conformally deposited on the fin, hardmask 120 and on exposed surfaces of the first doped layer 111 using, for example, a conformal deposition process such as, but not necessarily limited to atomic layer deposition (ALD) or chemical vapor deposition (CVD). In accordance with an embodiment of the present invention, the dielectric liner layer 121 comprises for example, an oxide, such as silicon oxide (SiOx), where x is, for example, 2, 1.99 or 2.01, and has a thickness of about 2 nm to about 3 nm.

Figure 4:
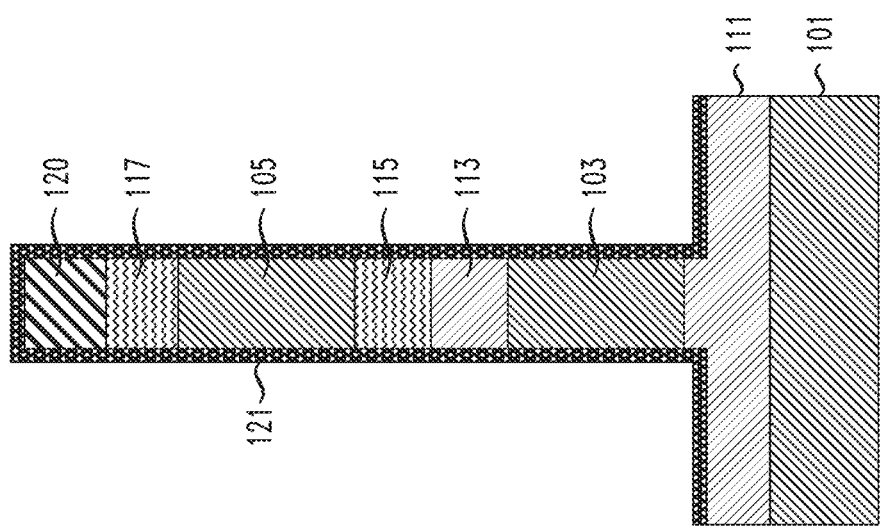
FIG. 4 is a cross-sectional view illustrating formation of a first spacer layer in a method of manufacturing a semiconductor device, according to an exemplary embodiment of the present invention.

FIG. 4 is a cross-sectional view illustrating formation of a first spacer layer in a method of manufacturing a semiconductor device, according to an exemplary embodiment of the present invention. Referring to FIG. 4, a first spacer layer 123 is formed on horizontal portions of the dielectric liner layer 121 adjacent the fin. Spacer material includes, but is not necessarily limited to, plasma enhanced chemical vapor deposition (PECVD)-type, high aspect ratio process (HARP)-type or high density plasma (HDP)-type low-K dielectric layers, including, but not necessarily limited to, SiBN, SiBCN, SiOCN or SiN. According to an embodiment, the first spacer layer 123 is deposited using, for example, directional deposition techniques, including, but not necessarily limited to, high density plasma (HDP) deposition, physical vapor deposition (PVD), and gas cluster ion beam (GCIB) deposition. The directional deposition deposits the spacer material preferably on the exposed horizontal surfaces, but not on lateral sidewalls (unless deposition on the horizontal surfaces also results in contact of the deposited material with lateral sidewalls). Spacer material formed on the dielectric liner layer 121 on top of the hardmask 120 (not shown) can be removed using a planarization step, such as, for example, chemical mechanical polishing (CMP). Other methods known to those of ordinary skill in the art, such as, for example, conformal deposition techniques and RIE, may alternatively be used to form the first spacer layer 123. A vertical height of the first spacer layer 123 is in the range of about 4 nm-about 10 nm, with 6 nm preferred.

Figure 5:
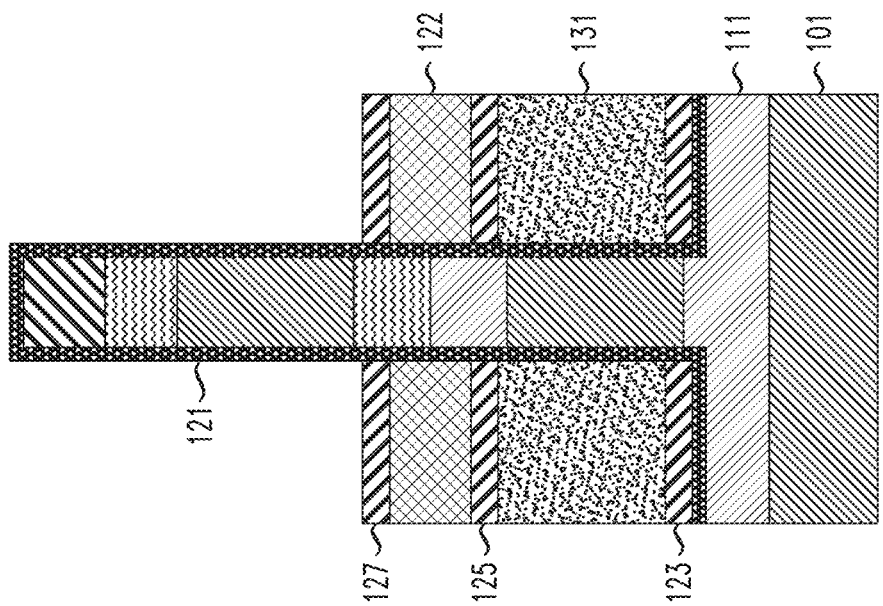
FIG. 5 is a cross-sectional view illustrating formation of a lower dummy gate in a method of manufacturing a semiconductor device, according to an exemplary embodiment of the present invention.

FIG. 5 is a cross-sectional view illustrating formation of a lower dummy gate in a method of manufacturing a semiconductor device, according to an exemplary embodiment of the present invention. Referring to FIG. 5, a lower dummy gate layer 131 is formed on the first spacer layer 123 adjacent the fin. The material for the dummy gate layer 131 includes, but is not necessarily limited to, amorphous germanium (a-Ge), amorphous silicon germanium (a-SiGe), amorphous silicon (a-Si) or amorphous carbon (a-C). According to an embodiment, the dummy gate layer 131 is deposited using, for example, directional deposition techniques, including, but not necessarily limited to, HDP deposition, PVD and GCIB deposition. The directional deposition deposits the dummy gate material preferably on the exposed horizontal surfaces, but not on lateral sidewalls (unless deposition on the horizontal surfaces also results in contact of the deposited material with lateral sidewalls). Dummy gate material formed on the dielectric liner layer 121 on top of the hardmask 120 (not shown) can be removed using a planarization step, such as, for example, CMP. Other methods known to those of ordinary skill in the art can also be used to form the dummy gate layer 131, such as, for example, blanket deposition of the dummy gate material followed by CMP and recessing of the dummy gate material to a desired height. For example, a vertical height of the dummy gate layer 131 is in the range of about 20 nm-about 50 nm. The dummy gate layer 131 extends above a vertical height of the undoped layer 103 to overlap part of the second doped layer 113.

Figure 6:
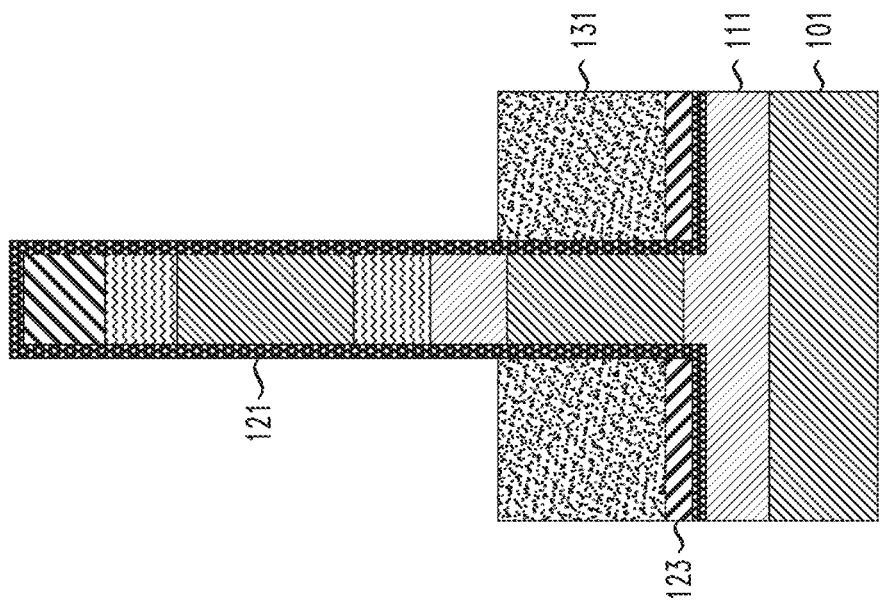
FIG. 6 is a cross-sectional view illustrating formation of a first sacrificial dielectric layer and of second and third spacer layers in a method of manufacturing a semiconductor device, according to an exemplary embodiment of the present invention.

FIG. 6 is a cross-sectional view illustrating formation of a first sacrificial dielectric layer and of second and third spacer layers in a method of manufacturing a semiconductor device, according to an exemplary embodiment of the present invention. Referring to FIG. 6, a second spacer layer 125 is formed on the dummy gate layer 131, a first sacrificial dielectric layer 122 is formed on the second spacer layer 125 and a third spacer layer 127 is formed on the first sacrificial dielectric layer 122.

The second spacer layer 125 is formed on horizontal portions of the dummy gate layer 131 adjacent the fin, and the third spacer layer 127 is formed on horizontal portions of the first sacrificial dielectric layer 122 adjacent the fin. The material of the second and third spacer layers 125 and 127 includes, but is not necessarily limited to, the materials noted in connection with the first spacer layer 123 such as, for example, SiBN, SiBCN, SiOCN or SiN. According to an embodiment, the second and third spacer layers 125 and 127 are deposited using, for example, directional deposition techniques, including, but not necessarily limited to, HDP deposition, PVD, and GCIB deposition. Other methods known to those of ordinary skill in the art, such as, for example, conformal deposition techniques and ME, may alternatively be used to form the second and third spacer layers 125 and 127. A vertical height of the second and third spacer layers 125 and 127, respectively, is in the range of about 4 nm-about 10 nm, with 6 nm preferred.

The first sacrificial dielectric layer 122 is formed on horizontal portions of the second spacer layer 125 adjacent the fin. The material of the first sacrificial dielectric layer 122 includes, but is not necessarily limited to, an oxide, such as SiOx, and has a vertical height of about 20 nm to about 60 nm. The sacrificial dielectric layer 122 overlaps both the second and third doped layers 113 and 115 (e.g., p+ and n+ doped layers), and as described further herein, is a sacrificial placeholder for later formed silicide layers 172 (see FIG. 14 and corresponding discussion). The second and third doped layers 113 and 115 form a common drain region for an NFET including layers 115, 105 and 117, and a PFET including layers 111, 103 and 113.

According to an embodiment, the sacrificial dielectric layer 122 is deposited using, for example, directional deposition techniques, including, but not necessarily limited to, HDP deposition, PVD, and GCM deposition. Other methods known to those of ordinary skill in the art, such as, for example, conformal deposition techniques and ME, may alternatively be used to form the sacrificial dielectric layer 122.

Figure 7:
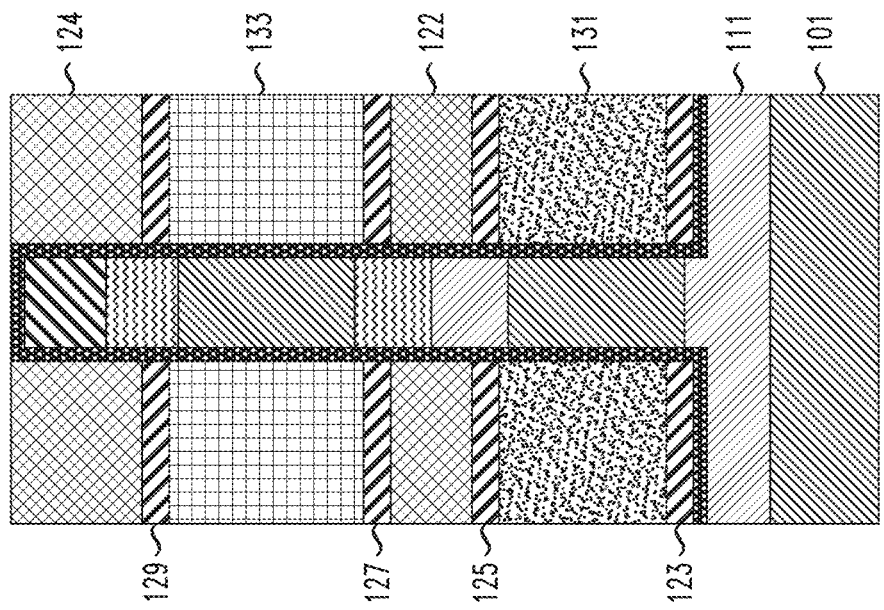
FIG. 7 is a cross-sectional view illustrating formation of an upper dummy gate in a method of manufacturing a semiconductor device, according to an exemplary embodiment of the present invention.

FIG. 7 is a cross-sectional view illustrating formation of an upper dummy gate in a method of manufacturing a semiconductor device, according to an exemplary embodiment of the present invention. Referring to FIG. 7, an upper dummy gate layer 133 is formed on the third spacer layer 127 adjacent the fin. The material for the dummy gate layer 133 includes, but is not necessarily limited to, a-Ge, a-SiGe, a-Si or a-C. The material of upper dummy gate layer 133 is different from the material of lower dummy gate layer 131 so that the lower dummy gate layer 131 can be selectively etched with respect to the upper dummy gate layer 133 (see FIG. 9 and corresponding discussion). The combination of the materials for upper and lower dummy gate layers 133 and 131 is chosen based at least in part on etch selectivity between upper and lower dummy gate layers 133 and 131. According to an embodiment, the lower dummy gate layer 131 includes a-Ge, and the upper dummy gate layer 133 includes a-Si. However, other combinations of materials for the upper and lower dummy gate layers 133 and 131 may be used (e.g., a-C and a-SiGe).

According to an embodiment, the dummy gate layer 133 is deposited using, for example, directional deposition techniques, including, but not necessarily limited to, HDP deposition, PVD and GCIB deposition. The directional deposition deposits the dummy gate material preferably on the exposed horizontal surfaces, but not on lateral sidewalls (unless deposition on the horizontal surfaces also results in contact of the deposited material with lateral sidewalls). Dummy gate material formed on the dielectric liner layer 121 on top of the hardmask 120 (not shown) can be removed using a planarization step, such as, for example, CMP. Other methods known to those of ordinary skill in the art can also be used to form the dummy gate layer 133, such as, for example, blanket deposition of the dummy gate material followed by CMP and recessing of the dummy gate material to a desired height. For example, a vertical height of the dummy gate layer 133 is in the range of about 20 nm-about 50 nm. The dummy gate layer 133 extends above a vertical height of the undoped layer 105 to overlap part of the fourth doped layer 117.

Figure 8:
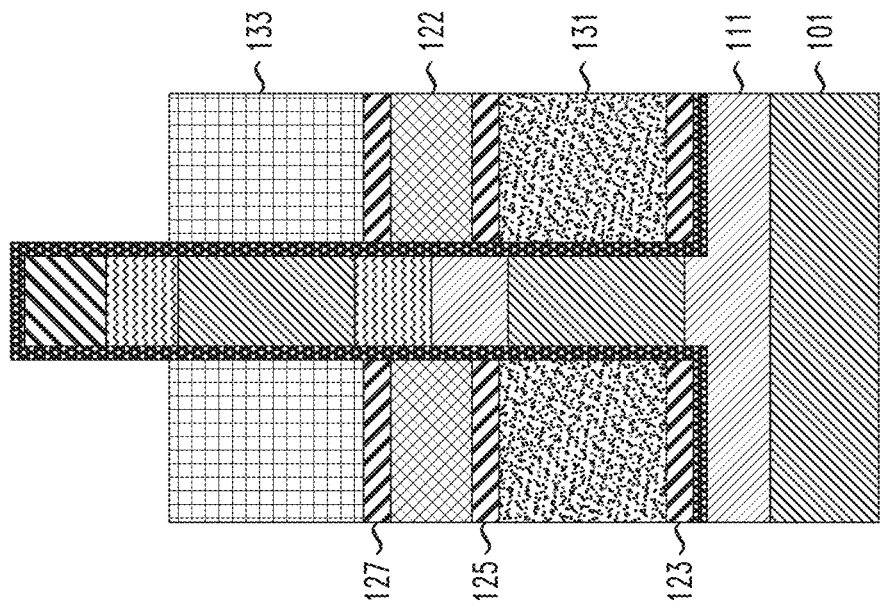
FIG. 8 is a cross-sectional view illustrating formation of a second sacrificial dielectric layer and of a fourth spacer layer in a method of manufacturing a semiconductor device, according to an exemplary embodiment of the present invention.

FIG. 8 is a cross-sectional view illustrating formation of a second sacrificial dielectric layer and of a fourth spacer layer in a method of manufacturing a semiconductor device, according to an exemplary embodiment of the present invention. Referring to FIG. 8, a fourth spacer layer 129 is formed on the upper dummy gate layer 133 and a second sacrificial dielectric layer 124 is formed on the fourth spacer layer 129.

The fourth spacer layer 129 is formed on horizontal portions of the upper dummy gate layer 133 adjacent the fin. The material of the fourth spacer layer 129 includes, but is not necessarily limited to, the materials noted in connection with the first, second and third spacer layers 123, 125 and 127 such as, for example, SiBN, SiBCN, SiOCN or SiN. According to an embodiment, the fourth spacer layer 129 is deposited using, for example, directional deposition techniques, including, but not necessarily limited to, HDP deposition, PVD, and GCIB deposition. Other methods known to those of ordinary skill in the art, such as, for example, conformal deposition techniques and RIE, may alternatively be used to form the fourth spacer layer 129. A vertical height of the fourth spacer layer 129 is in the range of about 4 nm-about 10 nm, with 6 nm preferred.

The second sacrificial dielectric layer 124 is formed on horizontal portions of the fourth spacer layer 129 adjacent the fin. The material of the second sacrificial dielectric layer 124 includes, but is not necessarily limited to, an oxide, such as SiOx, and has a vertical height of about 20 nm-about 100 nm. The sacrificial dielectric layer 124 overlaps both the fourth doped layer 117 (e.g., n+ doped layer), and as described further herein, is a sacrificial placeholder for later formed silicide layers 174 (see FIG. 14 and corresponding discussion). The fourth doped layer 117 forms a source region for an NFET including layers 115, 105 and 117.

According to an embodiment, the sacrificial dielectric layer 124 is deposited using, for example, directional deposition techniques, including, but not necessarily limited to, HDP deposition, PVD, and GCM deposition. Other methods known to those of ordinary skill in the art, such as, for example, conformal deposition techniques and RIE, may alternatively be used to form the sacrificial dielectric layer 124. Following deposition of the second sacrificial dielectric layer 124, a planarization process, such as, for example, CMP, is performed to remove excess materials from the dielectric liner layer 121 on top of the hardmask 120, and to bring the vertical height of the second sacrificial dielectric layer 124 even or substantially even with that of the outer surface of the dielectric liner layer 121 on top of the hardmask 120.

Figure 9:
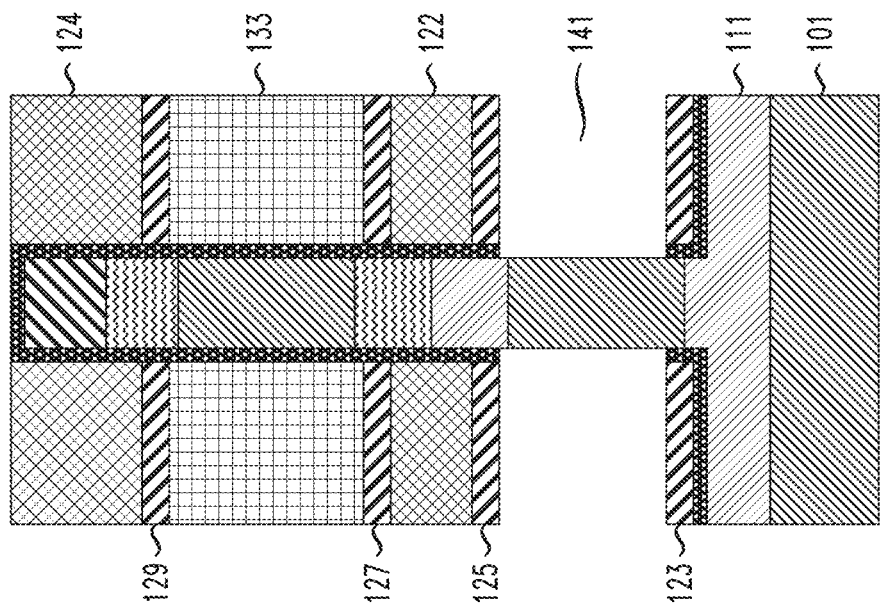
FIG. 9 is a cross-sectional view illustrating removal of the lower dummy gate and an exposed portion of the dielectric liner layer in a method of manufacturing a semiconductor device, according to an exemplary embodiment of the present invention.

FIG. 9 is a cross-sectional view illustrating removal of the lower dummy gate layer and an exposed portion of the dielectric liner layer in a method of manufacturing a semiconductor device, according to an exemplary embodiment of the present invention. Referring to FIG. 9, the lower dummy gate layer 131 and subsequently exposed portions of the dielectric liner layer 121 adjacent the lower dummy gate layer 131 are selectively removed. For example, when the lower dummy gate layer 131 includes a-Ge, and the upper dummy gate layer 133 includes a-Si, the lower dummy gate layer 131 is selectively etched using, for example, hot water at a temperature of about 40° C. to about 60° C. or hydrogen peroxide ($H_2O_2$). Following removal of the lower dummy gate layer 131, the exposed portions of the dielectric liner layer 121, which were under the lower dummy gate layer 131 are selectively removed with respect to the material of the first and second spacer layers 123 and 125 using, for example, diluted HF, to create vacant areas 141. According to an embodiment, etching of the exposed dielectric liner layer 121 is performed just long enough to remove the about 2 nm-about 3 nm thick dielectric liner layer 121, with possibly some over-etching.

Figure 10:
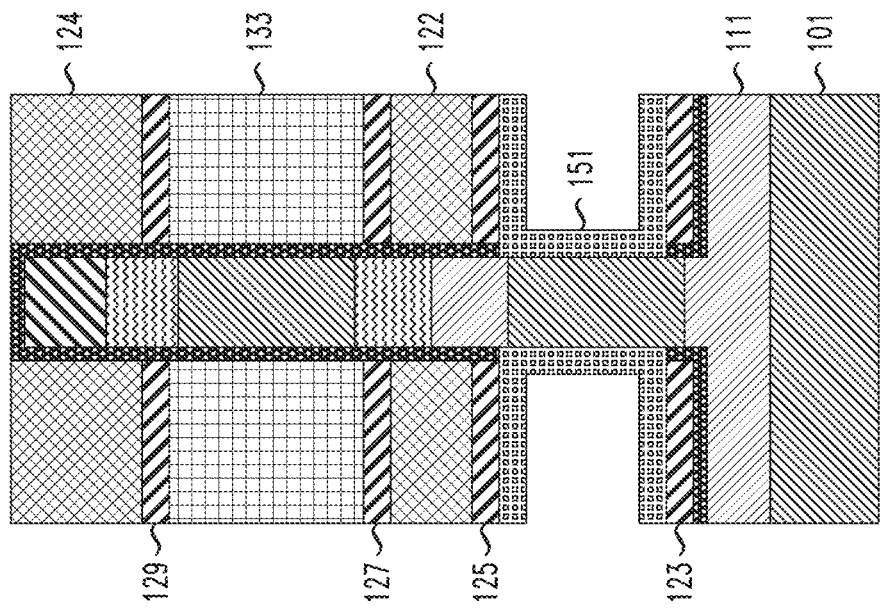
FIG. 10 is a cross-sectional view illustrating formation of high-K gate dielectric layers in a method of manufacturing a semiconductor device, according to an exemplary embodiment of the present invention.

FIG. 10 is a cross-sectional view illustrating formation of high-K gate dielectric layers in a method of manufacturing a semiconductor device, according to an exemplary embodiment of the present invention. Referring to FIG. 10, high-K dielectric layers 151 are formed to line sides in the vacant areas 141. More specifically, the high-k dielectric layers 151 are conformally deposited using, for example, ALD, on upper surfaces of the first spacer layer 123, bottom surfaces of the second spacer layer 125 and lateral sidewalls of the exposed portions of the fin including parts of the undoped layer 103 and, in some instances, minimal portions of the second doped layer 113.

The high-k dielectric layers 151 include, for example, a high-k material including, but not necessarily limited to, HfO$_2$ (hafnium oxide), ZrO$_2$ (zirconium dioxide), hafnium zirconium oxide, Al$_2$O$_3$ (aluminum oxide), and Ta$_2$O$_5$ (tantalum pentoxide).

Figure 11:
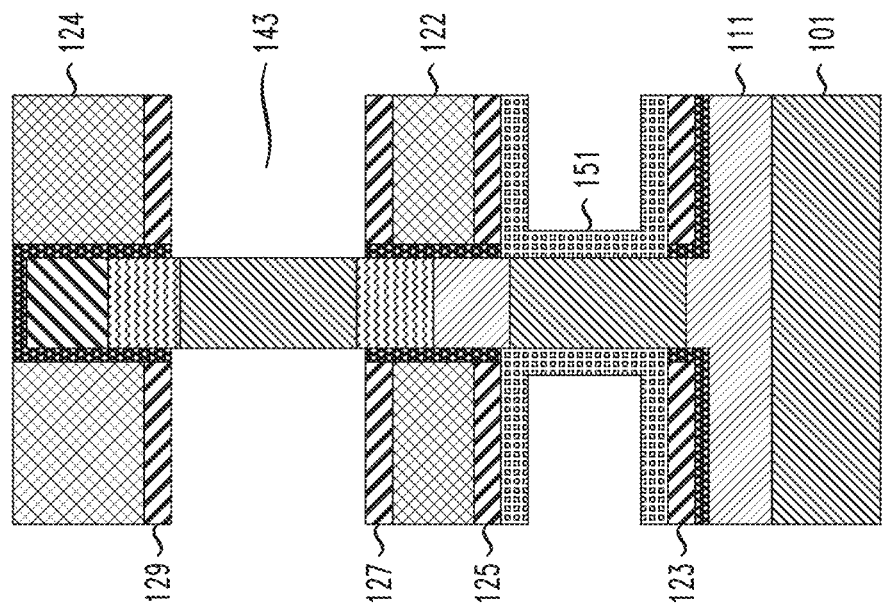
FIG. 11 is a cross-sectional view illustrating removal of the upper dummy gate and an exposed portion of the dielectric liner layer in a method of manufacturing a semiconductor device, according to an exemplary embodiment of the present invention.

FIG. 11 is a cross-sectional view illustrating removal of the upper dummy gate and an exposed portion of the dielectric liner layer in a method of manufacturing a semiconductor device, according to an exemplary embodiment of the present invention. Referring to FIG. 11, the upper dummy gate layer 133 and subsequently exposed portions of the dielectric liner layer 121 adjacent the upper dummy gate layer 133 are selectively removed. For example, the upper dummy gate layer 133 including, for example, a-Si, is selectively etched using, for example, Ammonia. Following removal of the upper dummy gate layer 133, the exposed portions of the dielectric liner layer 121, which were under the upper dummy gate layer 133 are selectively removed with respect to the material of the third and fourth spacer layers 127 and 129 using, for example diluted HF, to create vacant areas 143. According to an embodiment, etching of the exposed dielectric liner layer 121 is performed just long enough to remove the about 2 nm-about 3 nm thick dielectric liner layer 121, with possibly some over-etching.

Figure 12:
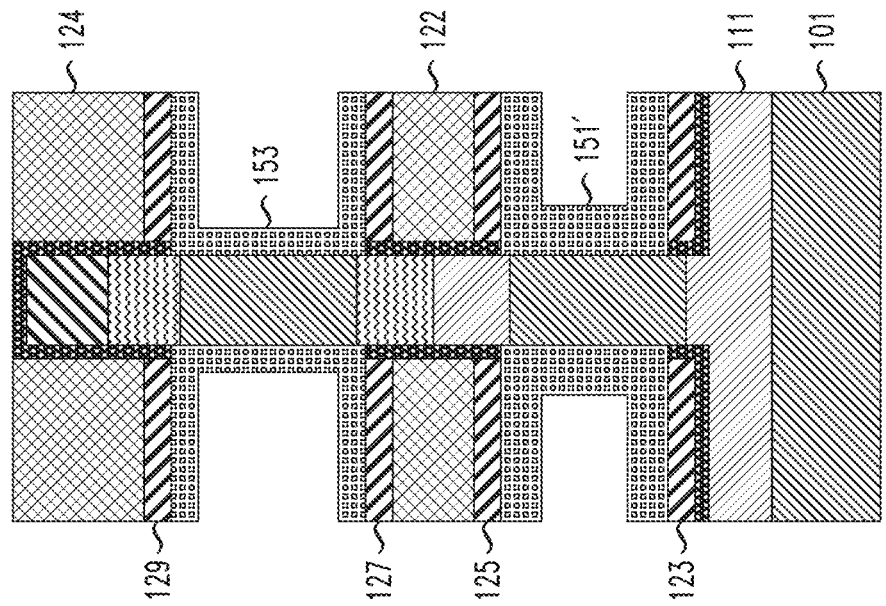
FIG. 12 is a cross-sectional view illustrating formation of high-K gate dielectric layers in a method of manufacturing a semiconductor device, according to an exemplary embodi

FIG. 12 is a cross-sectional view illustrating formation of high-K gate dielectric layers in a method of manufacturing a semiconductor device, according to an exemplary embodiment of the present invention. Referring to FIG. 12, high-K dielectric layers 153 are formed to line sides in the vacant areas 143. More specifically, the high-k dielectric layers 153 are conformally deposited on upper surfaces of the third spacer layer 127, bottom surfaces of the fourth spacer layer 129 and lateral sidewalls of the exposed portions of the fin including parts of the undoped layer 105 and, in some instances, minimal portions of the third and fourth doped layers 115 and 117.

The deposition of the high-K dielectric layers 153 in connection with the upper gate region increases the thicknesses of the high-k dielectric layers 151 in the lower gate region to create high-K dielectric layers 151', which are thicker than the high-K dielectric layers 151 and 153. Additional high-K material deposited to form the high-K dielectric layers 153 is also deposited on the high-K dielectric layers 151 to result in the thicker high-K dielectric layers 151'. For example, a thickness of the high-k dielectric layers 153 is in the range of about 1 nm-about 5 nm, while a thickness of the high-k dielectric layers 151' is in the range of about 5 nm-about 25 nm, but thinner or thicker layers may be used as well.

The high-k dielectric layers 151' and 153 include, for example, a high-k material including, but not necessarily limited to, HfO$_2$, ZrO$_2$, hafnium zirconium oxide, Al$_2$O$_3$, and Ta$_2$O$_5$. The high-k dielectric layers 151' are storage oxides, the high-k dielectric layers 153 are gate oxides.

Figure 13:
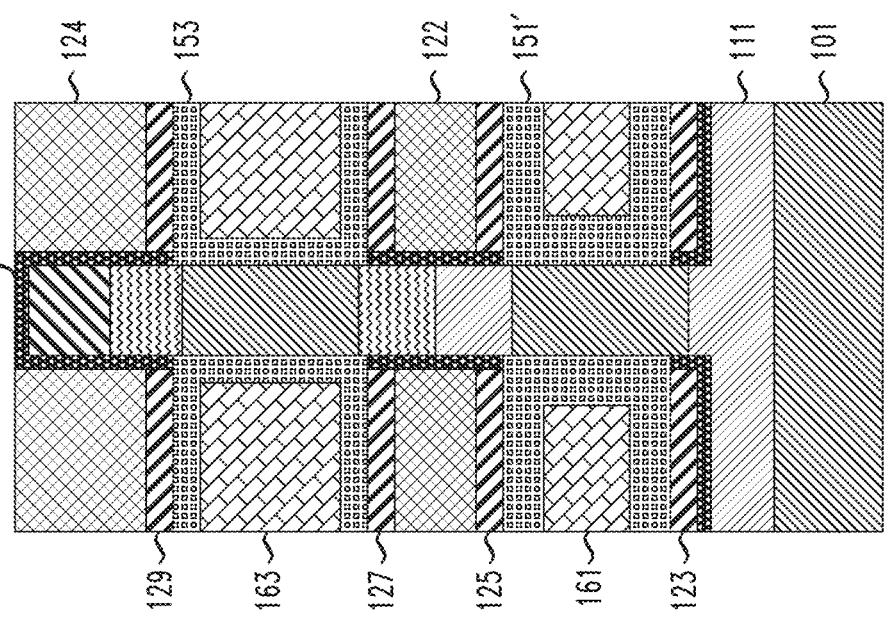
- FIG. 13 is a cross-sectional view illustrating metal gate deposition and planarization in a method of manufacturing a semiconductor device, according to an exemplary embodiment of the present invention.

FIG. 13 is a cross-sectional view illustrating metal gate deposition and planarization in a method of manufacturing a semiconductor device, according to an exemplary embodiment of the present invention. Referring to FIG. 13, gate metal layers 161 and 163 are formed in the vacant areas 141 and 143 on the high-K dielectric layers 151' and 153 around the fin. The high-K dielectric layers 151' and 153 are formed around and contact the fin 104. The gate metal layers 161 and 163 include, for example, a low resistance metal, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof.

The gate metal layers 161 and 163 are deposited using, for example, one or more deposition techniques including, but not limited to, CVD, PECVD, radio-frequency CVD (RFCVD), PVD, ALD, molecular layer deposition (MLD), molecular beam deposition (MBD), pulsed laser deposition (PLD), liquid source misted chemical deposition (LSMCD), sputtering and/or plating. Gate metal layer deposition is followed by a planarization process, such as, for example, CMP to remove excess gate metal material overflowing from the vacant areas 141 and 143 and planarize sides of the structure 100. As can be seen in FIG. 13, due to the greater thickness of the high-K dielectric layer 151' than that of the high-K dielectric layer 153, the resulting area of the gate metal layer 161 is less than that of the gate metal layer 163. The combination of the gate metal and high-K dielectric layers 161, 163 and 151' and 153 may be referred to herein as "gate regions."

Figure 14:
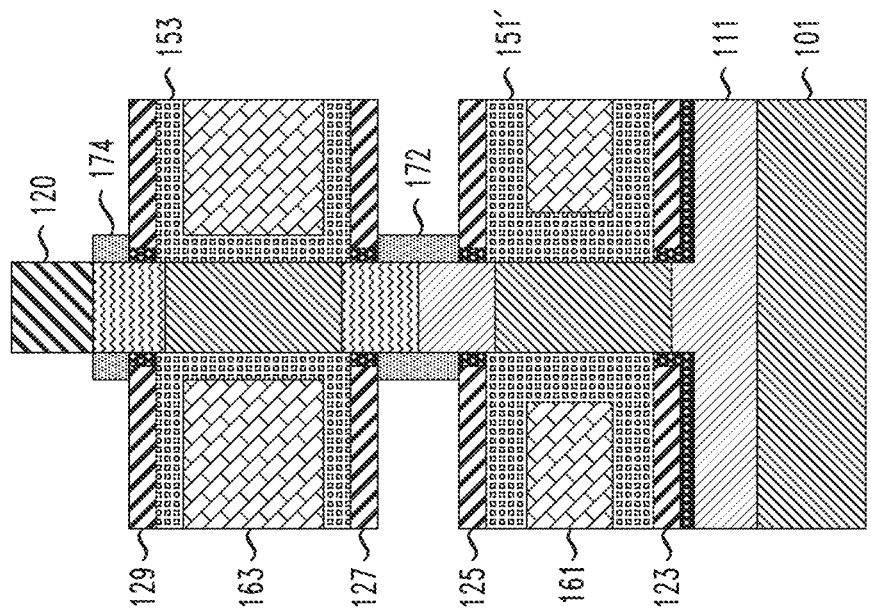
FIG. 14 is a cross-sectional view illustrating removal of first and second sacrificial dielectric layers and silicide formation in a method of manufacturing a semiconductor device, according to an exemplary embodiment of the present invention.

FIG. 14 is a cross-sectional view illustrating removal of first and second sacrificial dielectric layers and silicide formation in a method of manufacturing a semiconductor device, according to an exemplary embodiment of the present invention. Referring to FIG. 14, the first and second sacrificial dielectric layers 122 and 124 are selectively removed to expose second and third doped regions 113 and 115, and fourth doped region 117. The selective removal of the first and second sacrificial dielectric layers 122 and 124 is performed using, for example, diluted HF.

As noted herein, the second and third doped regions 113 and 115 (e.g., p+ and n+ doped regions) form a common drain region for a lower PFET including layer 111 (e.g., p+ source region), layer 103 (undoped channel region) and layer 113 (e.g., p+ drain region), and an upper NFET including layer 115 (e.g., n+ drain region), layer 105 (undoped channel region) and layer 117 (e.g., n+ source region).

In order to form the silicide layers 172 and 174 on the doped regions 113, 115 and 117, a silicidation process is performed to form an alloy including a portion of a contact material with an underlying silicon layer. More specifically, a metal layer including a material capable of forming a silicide is deposited on the exposed portions of the layers 113, 115 and 117 after removal of the first and second sacrificial dielectric layers 122 and 124. The material can include, but is not necessarily limited to, metals such as cobalt, nickel, platinum, titanium, tantalum and tungsten, or combinations thereof. The material preferably is thermally stable, being able to remain stable under high temperatures due to subsequent steps performed under high temperature conditions. The metal layer can be deposited using deposition techniques including, but not limited to, CVD, PECVD, RFCVD, PVD, ALD, MLD, MBD, PLD, and/or LSMCD, sputtering, and/or plating.

A process, such as, for example, an annealing process at approximately 300° C. to approximately 450° C., is performed so that the metal layer reacts with silicon in the layers 113, 115 and 117 to convert a portion of the layers 113, 115 and 117 into silicide layers 172 and 174. The annealing process is not necessarily limited to the temperature range above, and may be performed at other temperatures if required. The silicide layers 172 and 174 may include, but are not necessarily limited to, cobalt silicide (CoSi$_x$), tungsten silicide (WSi$_x$), nickel silicide (NiSi), nickel platinum silicide (NiPt$_y$Si$_x$), tantalum silicide (TaSi$_x$), titanium silicide (TiSi$_x$) and combinations thereof.

In the case of the layers 113 and 115, which contact each other, the silicide layers 172 formed on top of the layers 113 and 115 electrically straps (e.g., connects) the layers 113 and 115 to form the common drain region.

Figure 15:
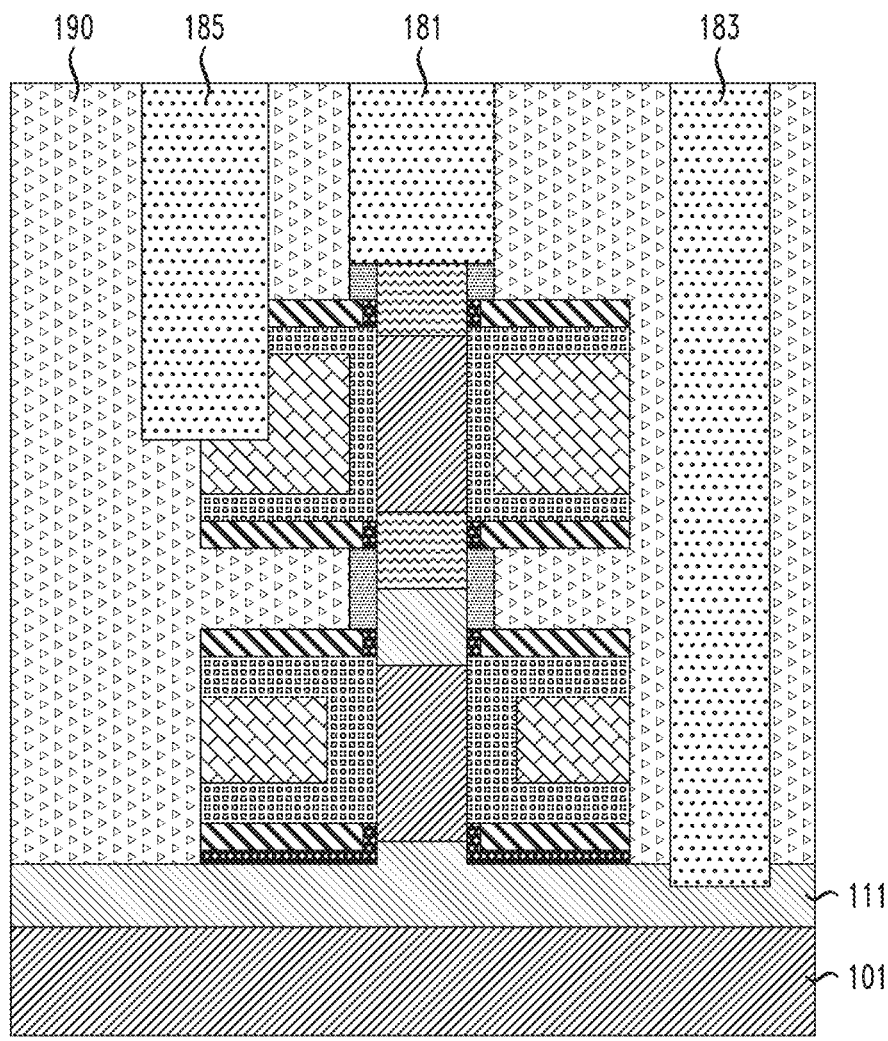
FIG. 15 is a cross-sectional view illustrating inter-level dielectric (ILD) layer and contact formation for an EPROM, in a method of manufacturing a semiconductor device, according to an exemplary embodiment of the present invention.

FIG. 15 is a cross-sectional view illustrating inter-level dielectric (ILD) layer and contact formation for an EPROM, in a method of manufacturing a semiconductor device, according to an exemplary embodiment of the present invention. FIG. 15 shows a wider view of the substrate 101 than in FIGS. 1-14. Referring to FIG. 15, the hardmask 120 is removed, and an ILD layer 190 is deposited on exposed portions of the first doped layer 111 on the side of the structure 100, and fills in exposed areas adjacent the silicide layers 172 and 174 formerly occupied by the first and second sacrificial dielectric layers 122 and 124. The ILD layer 190 is also deposited on top of the fourth doped layer 117. The ILD layer 190 includes a dielectric material, such as, but not limited to SiOx, SiOC, SiOCN or some other dielectric. The ILD layer 190 can be deposited using deposition techniques including, but not limited to, CVD, PECVD, RFCVD, PVD, ALD, MLD, MBD, PLD, and/or LSMCD, sputtering, and/or plating.

Using, for example, lithography followed by ME, trenches are respectively opened in the ILD layer 190 to form contacts 181, 183 and 185. Contact 181 is to the fourth doped layer 117, which functions as the source of the upper FET (e.g., NFET source (Vss)). Contact 183 is to the first doped layer 111, which functions as the source of the lower FET (e.g., PFET source (Vdd)). Contact 185 is to the metal gate layer 163, which functions as the gate of the upper FET (e.g., NFET gate (Vin)).

Contacts 181, 183 and 185 are formed in the trenches by filling the trenches with contact material, such as, for example, electrically conductive material including, but not necessarily limited to, tungsten, cobalt, zirconium, tantalum, titanium, aluminum, ruthenium, and/or copper. A liner layer (not shown) including, for example, titanium and/or titanium nitride, may be formed on the doped layers 111 and 117, on the gate metal layer 163, and on side and bottom surfaces of the trenches before filling the trenches with the contact material layers. Deposition of the contact material layers can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP.

According to an embodiment, the EPROM structure 100 in FIG. 15 is formed by stacking an NFET on a floating-gate PFET, and silicide strapping the NFET and PFET drains.

Figure 16:
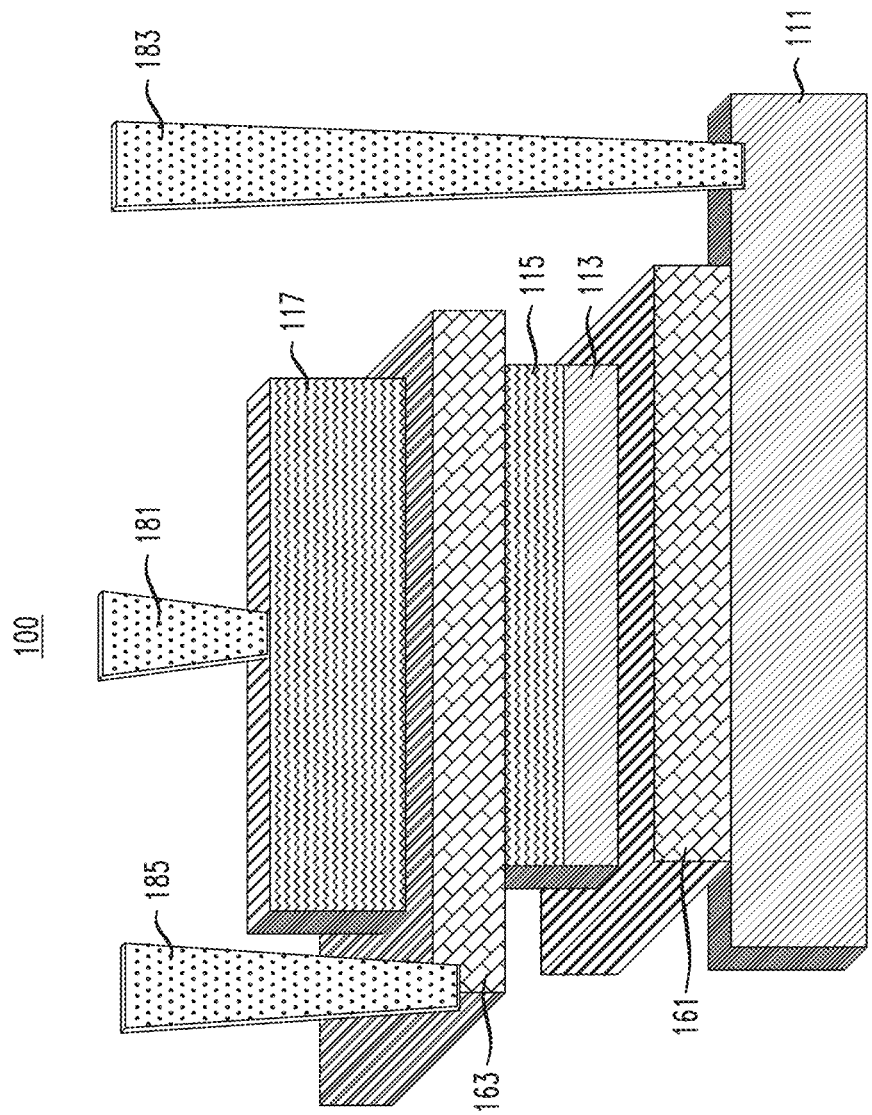
FIG. 16 is a schematic three-dimensional view illustrating a structure of two stacked VFETs in parallel with a common drain, and gate and source contacts, according to an embodiment of the invention.
Figure 17:
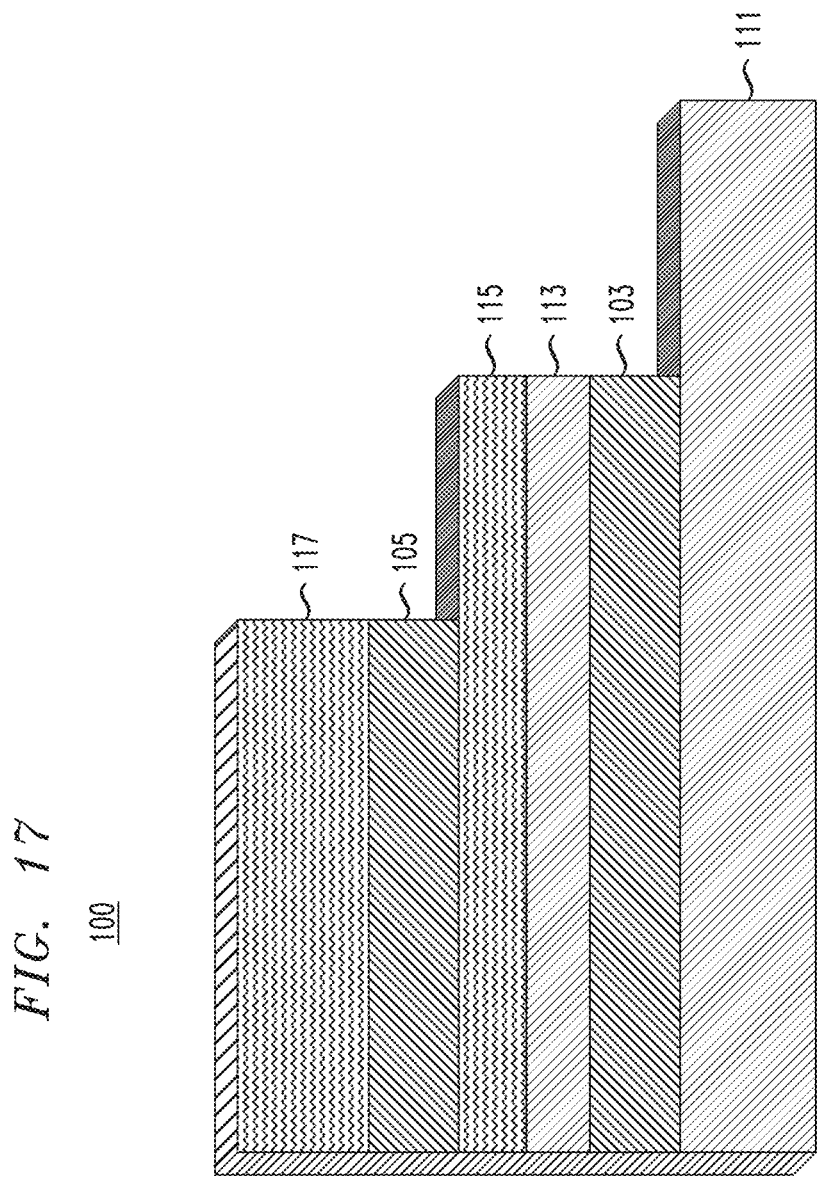
FIG. 17 is a schematic three-dimensional view illustrating source, drain and channel structures for two stacked VFETs, according to an embodiment of the invention.

FIGS. 16 and 17 are high-level schematic three-dimensional views where additional layers and/or structures shown in FIGS. 1-15 and/or 18 have been intentionally omitted for simplicity to illustrate certain features of the embodiments.

FIG. 16 illustrates the structure 100 of the two stacked VFETs from FIG. 15 in parallel with a common drain (second and third doped layers 113 and 115), a gate contact 185 to gate metal layer 163 and source contacts 181 and 183, respectively, to lower and upper source regions (first doped layer 111 and fourth doped layer 117). The floating gate 161 is also illustrated in FIG. 16.

FIG. 17 illustrates source, drain and channel structures for the two stacked VFETs from FIG. 15. Instead of illustrating the gate regions which wrap around channel regions (e.g., undoped layers 103 and 105), for simplicity, FIG. 17 omits the gate metal layers 161 and 163 to illustrate the channel regions 103 and 105 and their configuration with respect to the lower source region (layer 111), common drain region (layers 113 and 115) and upper source region (layer 117).

Figure 18:
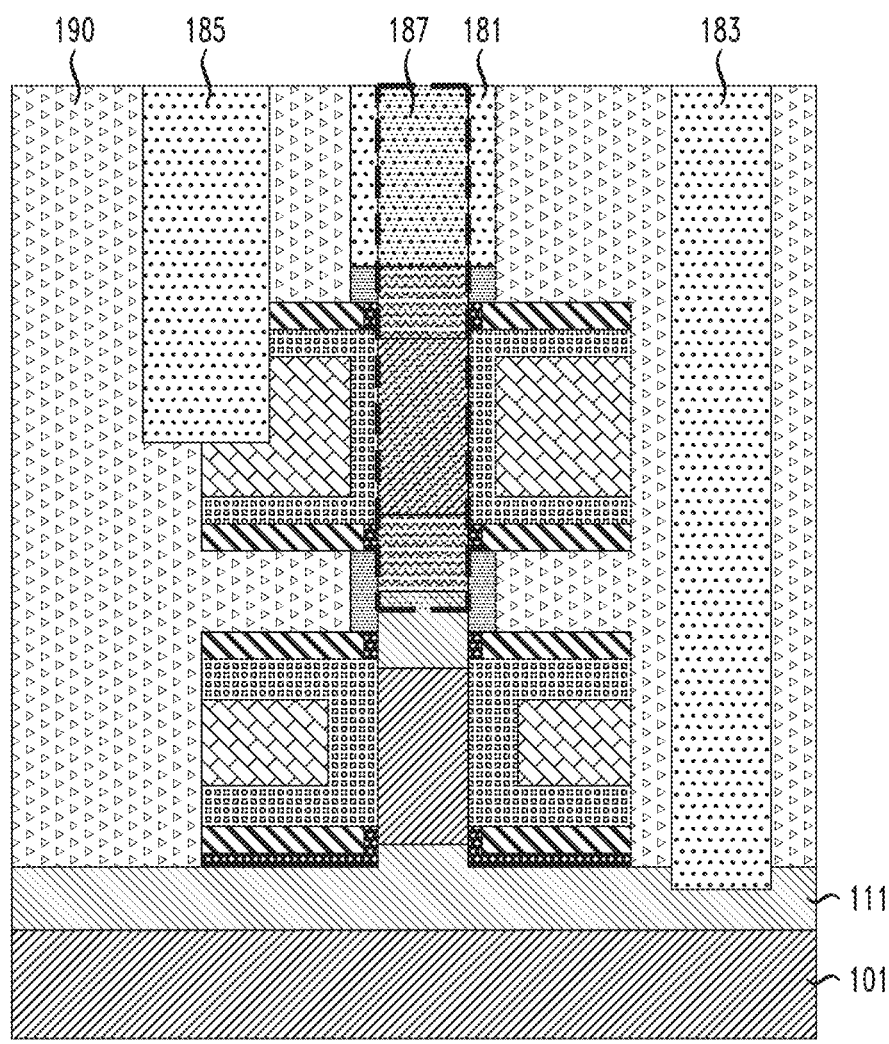
FIG. 18 is a cross-sectional view illustrating ILD layer and contact formation for a programmable CMOS inverter in a method of manufacturing a semiconductor device, according to an exemplary embodiment of the present invention.

FIG. 18 is a cross-sectional view illustrating ILD layer and contact formation for a programmable CMOS inverter in a method of manufacturing a semiconductor device, according to an exemplary embodiment of the present invention. The structure 102 in FIG. 18 is similar to the structure 100 shown in FIG. 15, except that FIG. 18 further includes a contact 187 to the common drain (layers 113 and 115) (Vout). The contact 187 is shown by a dotted line and is located in a portion of the ILD layer 190 electrically isolated from contacts 181, 183 and 185. Like the contacts 181, 183 and 185, the contact 187 is formed in a trench in the ILD layer 190 filled with contact material, such as, for example, electrically conductive material, and can include a liner layer.

The structure 102 in FIG. 18 is a programmable CMOS inverter formed by stacking an NFET on a floating-gate PFET, silicide strapping the NFET and PFET drains, and the common drain being contacted (through contact 187) and wired out. As can be understood from FIGS. 15 and 18, the gate metal layer 161 is not connected to a contact and is surrounded by dielectric layers, such that it is electrically isolated and, therefore, floating.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
   forming a first vertical transistor on a semiconductor substrate;
   forming a second vertical transistor stacked on the first vertical transistor; and
   forming a silicide layer on a first drain region of the first vertical transistor and on a second drain region of the second vertical transistor, wherein the silicide layer electrically connects the first and second drain regions to each other;
   wherein forming the silicide layer comprises:
      forming a sacrificial layer on the first and second drain regions;
      removing the sacrificial layer to expose the first and second drain regions; and
      performing a silicidation process to form the silicide layer.

2. The method according to claim 1, wherein the first vertical transistor comprises a floating gate.

3. The method according to claim 1, wherein forming the first vertical transistor comprises:
   forming a bottom source region on a semiconductor substrate;
   forming a first channel region extending vertically from the bottom source region;
   forming the first drain region on an upper portion of the first channel region; and
   forming a first gate region around the first channel region.

4. The method according to claim 3, wherein forming the second vertical transistor comprises:
   forming the second drain region on an upper portion of the first drain region;
   forming a second channel region extending vertically from the second drain region;
   forming a top source region on an upper portion of the second channel region; and
   forming a second gate region around the second channel region.

5. The method according to claim 4, wherein the first gate region comprises a first gate metal layer formed on a first high-K dielectric layer, and the second gate region comprises a second gate metal layer formed on a second high-K dielectric layer.

6. The method according to claim 4, further comprising forming an additional silicide layer on the top source region.

7. The method according to claim 1, wherein the first vertical transistor is a p-type field effect transistor (PFET) and the second vertical transistor is an n-type field effect transistor (NFET).

8. The method according to claim 1, wherein the first and second drain regions have different doping types from each other.

9. The method according to claim 1, further comprising forming a contact layer to the first and second drain regions.

10. A method for manufacturing a semiconductor device, comprising:
forming a first vertical transistor on a semiconductor substrate;
forming a second vertical transistor stacked on the first vertical transistor; and
forming a silicide layer on a first drain region of the first vertical transistor and on a second drain region of the second vertical transistor, wherein the silicide layer electrically connects the first and second drain regions to each other;
wherein forming the first vertical transistor comprises:
   forming a bottom source region on a semiconductor substrate;
   forming a first channel region extending vertically from the bottom source region;
   forming the first drain region on an upper portion of the first channel region; and
   forming a first gate region around the first channel region;
wherein forming the second vertical transistor comprises:
   forming the second drain region on an upper portion of the first drain region;
   forming a second channel region extending vertically from the second drain region;
   forming a top source region on an upper portion of the second channel region; and
   forming a second gate region around the second channel region;
wherein the first gate region comprises a first gate metal layer formed on a first high-K dielectric layer, and the second gate region comprises a second gate metal layer formed on a second high-K dielectric layer; and
wherein the first high-K dielectric layer has a greater thickness than the second high-K dielectric layer.

11. A method for manufacturing a semiconductor device, comprising:
forming a first vertical transistor on a semiconductor substrate;
forming a second vertical transistor stacked on the first vertical transistor;
forming a silicide layer on a first drain region of the first vertical transistor and on a second drain region of the second vertical transistor, wherein the silicide layer electrically connects the first and second drain regions to each other;
wherein forming the first vertical transistor comprises:
   forming a bottom source region on a semiconductor substrate;
   forming a first channel region extending vertically from the bottom source region;
   forming the first drain region on an upper portion of the first channel region; and
   forming a first gate region around the first channel region;
wherein forming the second vertical transistor comprises:
   forming the second drain region on an upper portion of the first drain region;
   forming a second channel region extending vertically from the second drain region;
   forming a top source region on an upper portion of the second channel region; and
   forming a second gate region around the second channel region;
forming a first dummy gate layer around the first channel region and forming a first dummy gate layer around the first channel region prior to forming the first and second gate regions; and
replacing the first and second dummy gate layers with the first and second gate regions respectively;
wherein the first and second dummy gate layers comprise different materials from each other.

12. The method according claim 11, wherein replacing the first and second dummy gate layers with the first and second gate regions comprises:
selectively removing the first dummy gate layer with respect to the second dummy gate layer; and
depositing a high-K dielectric material on the first channel region in an area left vacant by the removal of the first dummy gate layer to form a first high-K dielectric layer.

13. The method according to claim 12, wherein replacing the first and second dummy gate layers with the first and second gate regions further comprises:
removing the second dummy gate layer; and
depositing additional high-K dielectric material on the second channel region in an area left vacant by the removal of the second dummy gate layer to form a second high-K dielectric layer; and
depositing the additional high-K material on the first high-K dielectric layer, wherein a thickness of the first high-K dielectric layer is increased by the deposition of the additional high-K material on the first high-K dielectric layer.

* * * * *